United States Patent [19]

Kennedy et al.

[11] Patent Number: 5,249,233
[45] Date of Patent: Sep. 28, 1993

[54] MULTIPATH NOISE MINIMIZER FOR RADIO RECEIVER

[75] Inventors: John F. Kennedy, Garden City; Robert D. Plowdrey, Livonia, both of Mich.

[73] Assignee: Ford Motor Company, Dearborn, Mich.

[21] Appl. No.: 863,665

[22] Filed: Apr. 6, 1992

[51] Int. Cl.⁵ .............................. H04H 5/00
[52] U.S. Cl. ........................ 381/13; 455/65; 455/296; 455/311; 455/316; 455/318
[58] Field of Search ............... 455/65, 296, 311, 316, 455/318; 381/13

[56] References Cited

U.S. PATENT DOCUMENTS

| | | | |
|---|---|---|---|
| 3,537,008 | 10/1970 | Lakatos | 325/65 |
| 4,521,918 | 6/1985 | Challen | 455/343 |
| 4,590,615 | 5/1986 | Ohtaki et al. | 455/304 |
| 4,694,500 | 9/1987 | Tazaki et al. | 381/10 |
| 4,878,252 | 10/1989 | Sessink | 455/276 |
| 4,881,274 | 11/1989 | Tazaki et al. | 455/296 |
| 4,910,799 | 3/1990 | Takayama | 455/296 |
| 5,202,924 | 4/1993 | Richards, Jr. | 381/13 |

Primary Examiner—Forester W. Isen
Attorney, Agent, or Firm—Mark Mollon; Roger L. May

[57] ABSTRACT

A frequency modulation (FM) stereo broadcast receiver detects the onset of multipath interference and initiates corrective action to minimize the audible effects of multipath. Under an unacceptable multipath interference condition, a multipath detection signal disables the FM RF mixer thereby preventing any further energy in the multipath event from entering succeeding sections of the receiver. This action reduces noise generated by multipath interference and allows the output to return to normal in a shorter time. In another aspect of the invention, a phase-locked loop employed in a stereo decoder circuit is latched during the multipath disturbance in order to avoid rapid changes in the phase of the regenerated pilot employed in the stereo decoder.

15 Claims, 2 Drawing Sheets

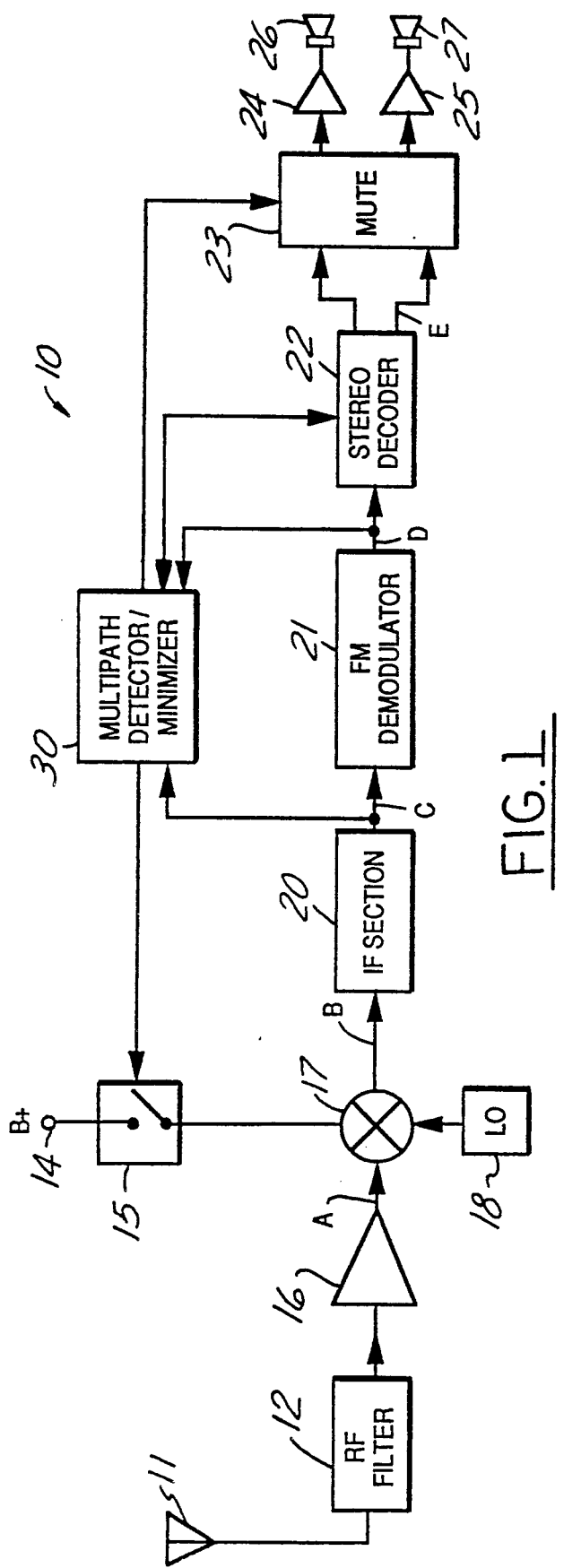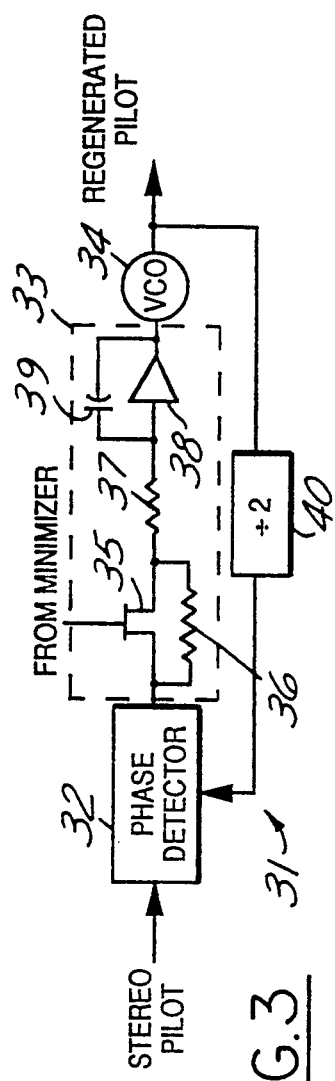
FIG.1
FIG.3

MULTIPATH NOISE MINIMIZER FOR RADIO RECEIVER

CROSS-REFERENCE TO RELATED APPLICATION

This application is related to commonly assigned application Ser. No. 07/863,996, entitled "MULTIPATH DETECTOR USING PHASE COMPARISON OF STEREO PILOT SIGNAL", filed concurrently herewith and incorporated herein by reference.

BACKGROUND OF THE INVENTION

The present invention relates in general to radio receivers with reduced distortion during multipath events, and more specifically to an FM stereo receiver with improved stereo operation during multipath events.

The problem of multipath distortion in radio receivers is well known. Multipath occurs when radio frequency (RF) signals following direct and indirect (i.e. reflected) paths from a transmitter to a receiver interfere with each other at the receiver Reflections can be caused by hills and buildings, for example.

Constructive and destructive interference of signals caused by interaction between the reflections and the direct line of sight transmission causes both signal distortion and rapid fluctuations in the received field intensity, especially in moving vehicles.

Multipath is a particularly annoying problem in reception of FM stereo broadcasts. A standard FM stereo signal includes a 19 kHz pilot carrier which is transmitted for the purpose of recovering the L-R frequency-multiplexed stereo signal When a multipath event occurs, the FM carrier signal experiences an impulse phase shift. The phase shifted FM signal is applied to the input of an RF mixer in the typical superheterodyne receiver. Due to the nonlinear characteristics of the mixer, the phase distortion is intensified and the duration of the phase disturbance is lengthened. The phase disturbance continues to lengthen in each succeeding section of the receiver. Demodulation of the FM signal produces a phase-shifted pilot signal which is then applied to the stereo decoder. The phase shift causes an abrupt unlocking of the phase-locked loop (PLL) normally employed in the stereo decoder to regenerate the pilot carrier. A rasping sound is heard in the audio output when the PLL is violently pulled out of lock by the multipath interference.

Prior art radio receivers are known wherein stereo separation is decreased during a multipath event in order to reduce the objectionable sounds associated with multipath. However, stereo separation cannot be changed fast enough to suppress all the multipath distortion. Furthermore, changing the stereo separation is itself a type of undesirable distortion. In addition, changing the stereo separation fails to correct for the lengthening of the multipath disturbance in each section of the receiver.

SUMMARY OF THE INVENTION

It is a principal object of the present invention to minimize multipath disturbances in a radio receiver.

It is further object of the present invention to reduce the impact of the property of multipath disturbance lengthening in each section of a receiver.

It is another object of the invention to avoid violent unlocking of a phase-locked loop in an FM stereo decoder.

These and other objects are achieved in the present invention by taking certain actions upon the detection of a multipath event. The power supply to an RF mixer in the receiver is interrupted upon detection of multipath, thus preventing any further energy in the multipath event from reaching succeeding sections of the receiver (where the impact of the distortion would otherwise be lengthened). The power is restored to the RF mixer before the loss of signal becomes audible, e.g., less than about 5 milliseconds.

In another aspect of the invention, noise caused by unlocking of the phase-locked loop in a stereo decoder is prevented by increasing the time constant of the PLL loop filter during the multipath disturbance. Thus, the phase-locked loop is not responsive to the random phase errors accompanying the multipath event.

BRIEF DESCRIPTION OF THE DRAWINGS

The novel features of the invention are set forth with particularity in the appended claims. The invention itself, however, both as to its organization and method of operation together with further objects and advantages thereof, may best be understood by reference to the following description taken in conjunction with the accompanying drawings in which:

FIG. 1 is a block diagram showing an FM stereo receiver according to the present invention.

FIG. 3 is a schematic diagram showing an improved phase-locked loop according to the present invention.

DETAILED DESCRIPTION OF PREFERRED EMBODIMENTS

Figure 2:
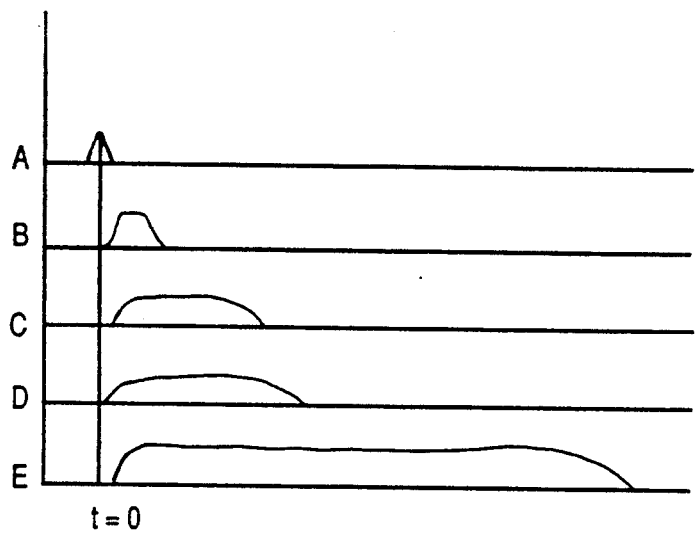
FIG. 2 shows propagation of a multipath disturbance as occurs in a prior art receiver without the corrective actions of the present invention.

FIG. 1 shows an FM stereo receiver 10 including an antenna 11 for receiving RF signals which may at times be subject to changing multipath interference, e.g., in an automobile. RF signals from antenna 11 are coupled through an RF filter 12 to an RF amplifier 16. Amplified RF signals from amplifier 16 are coupled to one input of a mixer 17. A power supply voltage +V is supplied at a terminal 14 and through a power switch 15 to RF mixer 17 when power switch 15 is closed. A mixing signal is provided from a local oscillator 18 to another input of mixer 17.

The output of mixer 17 is provided to an IF section 20 for providing IF filtering and amplification to produce an IF signal. An FM demodulator 21 demodulates the IF signal from IF section 20 to produce a baseband signal.

If the received broadcast is an FM stereo broadcast, then the demodulated signal includes a baseband stereo sum channel, a 19 kHz pilot signal, and stereo difference channels modulated on a suppressed 38 kHz subcarrier. These are all input to stereo decoder 22 which generates left and right stereo signals which are coupled through a mute circuit 23 to amplifiers 24 and 25 and speakers 26 and 27.

Receiver 10 further includes a multipath detector/minimizer 30 for sensing the onset of multipath distortion. Minimizer 30 may, for example, be connected to receive the IF signal from IF section 20 and/or the demodulated FM signal from FM demodulator 21 in order to detect multipath events. For example, it is known to detect multipath by measuring fluctuations in the received signal strength of the IF signal. Alternatively, multipath can be detected by measuring particular noise components in the demodulated FM signal. A preferred technique for detecting multipath by measuring phase shifts in the pilot signal is disclosed in related application Ser. No. 07/863,996, which is mentioned above.

Minimizer 30 is connected to Power switch 15 so as to remove power from RF mixer 17 during a multipath event. When power switch 15 is opened, the RF mixer output is quickly disabled and the phase distortion accompanying the multipath event is stopped at the mixer output. In a preferred embodiment, the length of time that the mixer is disabled is determined by the severity of the multipath event, e.g., the magnitude of the phase shift in the multipath event. The time during which the RF mixer is disabled must have a duration less than about 5 milliseconds to avoid audible distortion.

Minimizer 30 is also connected to stereo decoder 22 for controlling the time constant of the stereo decoder phase-locked loop. In the absence of multipath, the time constant of the phase-locked loop has a conventional value allowing the phase-locked loop to maintain lock on the stereo pilot signal. Upon the occurrence of multipath, the time constant is lengthened to maintain a stable (i.e., latched) output in the phase-locked loop. With the PLL latched, the regenerated pilot signal used in the stereo decoder maintains a fixed phase and frequency and is substantially unaffected by the multipath-induced impulse phase shift of the stereo pilot signal. Preferably, the phase-locked loop is latched during the same time period when the RF mixer is disabled. If the multipath event has ended by the time that the phase-locked loop is unlatched, then the phase-locked loop output should be substantially in phase with the multipath-free stereo pilot signal and the phase-locked loop will maintain lock. Thus, abrupt changes in the phase-locked loop output signal, which would cause the undesirable rasping sound heard at the speaker output, are avoided.

Minimizer 30 may be further coupled to a mute circuit 23 to provide audio blanking during the multipath disturbance. Power switch 15, stereo decoder 22, and mute circuit 23 are preferably all controlled by a single Multipath Detect Signal from minimizer 30.

FIG. 2 illustrates the lengthening of a multipath disturbance in a prior art receiver. Curves A-E in FIG. 2 show the magnitude of the phase disturbance at points A-E of FIG. 1 which would occur without minimizer 30. An impulse phase shift in the stereo pilot signal occurs at point A (the input to the RF mixer). Curves B, C, D and E show the increased duration of the phase disturbance at points B, C, D, and E of FIG. 1 which would occur in a prior art receiver.

FIG. 3 illustrates a phase-locked loop (PLL) 31 contained in stereo decoder 22 to provide a regenerated pilot for purposes of demodulating the stereo difference channel. Use of a regenerated pilot signal is conventional in stereo decoders. The received 19 kHz stereo pilot signal is provided to a phase detector 32. The output of phase detector 32 is connected to a loop filter 33 having its output connected to the input of a voltage controlled oscillator (VCO) 34. The output of VCO 34 comprises a 38 kHz regenerated pilot signal used to demodulate the stereo difference channel. The regenerated pilot signal is also connected back to a second input of phase detector 32 through a divide-by-2 circuit 40. The output of divide-by-2 circuit 40 is a 19 kHz signal that is in quadrature (i.e., phase shifted by 90°) with respect to the stereo pilot signal.

Loop filter 33 is specially adapted to provide a switchable time constant for purposes of latching PLL 31 at a long time constant in response to the Multipath Detect signal. Thus, a field-effect transistor (FET) 35 has its gate connected to receive the Multipath Detect Signal from minimizer 30. The source and drain of FET 35 are connected to respective ends of a resistor 36. The parallel combination of FET 35 and resistor 36 is connected in series with a resistor 37 between the output of phase detector 32 and the input of an operational amplifier (op amp) 38. A capacitor 39 is connected between the input and output of op amp 38. The output of op amp 38 is connected to the input of VCO 34.

The Multipath Detect Signal employs negative logic signals so that FET 35 is rendered conductive in the absence of multipath and resistor 36 does not affect the time constant. Loop filter 33 acts as a Proportional-integral controller providing a time constant determined by resistor 37 and capacitor 39 as is conventional in the art. In the presence of multipath, however, FET 35 is rendered nonconductive thereby adding the resistance of resistor 36 to the time constant circuit. Resistor 36 has a high resistance and causes the phase-locked loop to be latched with a long time constant so that the regenerated pilot is temporarily fixed in phase and frequency.

Figure 4:
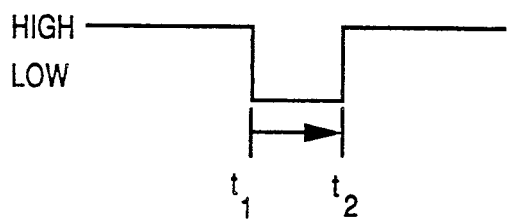
FIG. 4 shows the multipath control signal of the present invention.

FET 35 is preferably an enhancement mode device which is rendered conductive in response to a positive voltage from minimizer 30. FIG. 4 shows the Multipath Detect Signal wherein a high logic level voltage indicates a normal condition and a low logic level voltage indicates a multipath event. A multipath event is detected at $t_1$ and the low Multipath Detect Signal has a duration from $t_1$ to $t_2$.

The duration of the low Multipath Detect Signal (i.e., the time during which corrective action is taken in the receiver) is determined by the severity of the multipath event. In the preferred embodiment, the severity of a multipath event is determined by the phase magnitude of the phase shift detected in the stereo pilot signal. The magnitude of the impulse phase shift can be determined using the detector described in co-pending application Ser. No. 07/863,996. Alternatively, the severity of a multipath event can be defined as the change in received signal strength of the FM signal or the noise power in the measured multipath noise, depending on the method used to detect multipath.

Figure 5:
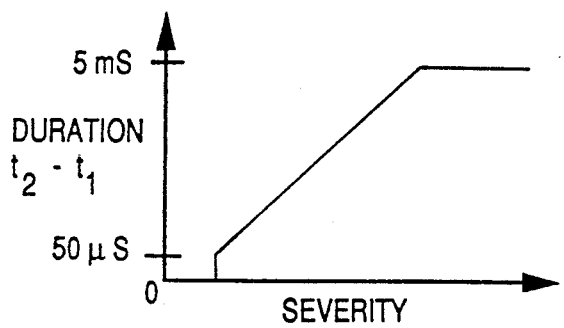
FIG. 5 plots a preferred control curve for the duration of the multipath control signal in dependence on multipath severity.

FIG. 5 plots the duration of a low Multipath Detect Signal against the severity of the multipath event. At less than a predetermined level of severity, no corrective action is taken. At a threshold level of severity, a multipath detect signal having a minimum duration of about 50 microseconds is produced by the multipath detector/minimizer. With increasing severity of the multipath event, an increasing duration is employed up to a maximum duration of 5 milliseconds. Any muting or disabling of the RF mixer extending for longer than 5 milliseconds would create objectionable noise in the output of the receiver.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A receiver apparatus comprising:
    RF mixer means for generating an intermediate frequency (IF) signal;
    switchable power means for selectably providing power to said RF mixer means; and
    multipath detector means for detecting the occurrence of multipath distortion in said IF signal and for momentarily causing said switchable power means to remove power from said RF mixer means upon a detected occurrence of multipath distortion.

2. The apparatus of claim 1 wherein said multipath detector means includes severity means for measuring the severity of a multipath distortion event and timing means for determining a time period proportional to said measured severity during which power is removed from said RF mixer means.

3. The apparatus of claim 1 further comprising carrier means for producing a pilot carrier signal from said IF signal, said carrier means including:
    a phase-locked loop; and
    latching means coupled to said multipath detector means for momentarily latching said phase-locked loop upon a detected occurrence of multipath distortion.

4. The apparatus of claim 3 wherein said multipath detector means includes severity means for measuring the severity of a multipath distortion event and timing means for determining a time period proportional to said measured severity during which power is removed from said RF mixer means and during which said phase-locked loop is latched.

5. The apparatus of claim 1 further comprising:
    output means for amplifying an audio output signal derived from said IF signal; and
    muting means for momentarily muting said output means upon a detected occurrence of multipath distortion.

6. A receiver apparatus comprising:
    RF mixer means for generating an intermediate frequency (IF) signal;
    carrier means for producing a regenerated carrier signal from said IF signal, said carrier means including a latchable phase-locked loop; and
    multipath detector means for detecting the occurrence of multipath distortion in said IF signal and for momentarily causing said phase-locked loop to latch upon a detected occurrence of multipath distortion.

7. The apparatus of claim 6 wherein said multipath detector means includes severity means for measuring the severity of a multipath distortion event and timing means for determining a time period proportional to said measured severity during which said phase-locked loop is latched.

8. A method for minimizing the effects of multipath distortion in an FM stereo receiver comprising the steps of:
    heterodyning a received radio frequency (RF) signal to produce an intermediate frequency (IF) signal;
    detecting the occurrence of multipath distortion affecting said IF signal; and
    interrupting said heterodyning step for a first time period in response to the detection of said occurrence of multipath distortion, wherein said time period is less than about 50 milliseconds.

9. The method of claim 8 further comprising the steps of:
    measuring the severity of said occurrence of multipath distortion; and
    providing said first time period with a duration proportional to said measured severity.

10. The method of claim 8 further comprising the steps of:
    regenerating a stereo carrier signal from a pilot signal using a phase-locked loop;
    recovering FM stereo signals using said regenerated carrier signal; and
    latching said phase-locked loop during said first time period.

11. The method of claim 8 further comprising the step of:
    muting the output of said receiver during said first time period.

12. A method for minimizing the effects of multipath distortion in an FM stereo receiver comprising the steps of:
    heterodyning a received radio frequency (RF) signal to produce an intermediate frequency (IF) signal;
    detecting the occurrence of multipath distortion affecting said IF signal;
    regenerating a stereo carrier signal from a pilot signal using a phase-locked loop;
    recovering FM stereo signals using said regenerated carrier signal; and
    latching said phase-locked loop for a first time period in response to the detection of said occurrence of multipath distortion, wherein said time period is less than about 50 milliseconds.

13. The method of claim 12 further comprising the steps of:
    measuring the severity of said occurrence of multipath distortion; and
    providing said first time period with a duration proportional to said measured severity.

14. The method of claim 12 further comprising the steps of:
    interrupting said heterodyning step during said first time period.

15. The method of claim 12 further comprising the step of:
    muting the output of said receiver during said first time period.

* * * * *